US009506972B2

(12) United States Patent
Carla et al.

(10) Patent No.: US 9,506,972 B2
(45) Date of Patent: Nov. 29, 2016

(54) SYSTEM AND METHOD FOR DETECTING AND LOCATING AN INSULATION FLAW IN A SOLAR GENERATOR ON A SPACE VEHICLE

(71) Applicants: ASTRIUM SAS, Suresnes (FR); CENTRE NATIONAL D'ETUDES SPATIALES CNES, Paris (FR)

(72) Inventors: Emmanuelle Carla, Toulouse (FR); Henri Barde, Ag Noordwijk (NL)

(73) Assignees: AIRBUS DEFENCE AND SPACE SAS, Les Mureaux (FR); CENTRE NATIONAL D'ETUDES SPATIALES CNES, Paris (FR)

( * ) Notice: Subject to any disclaimer, the term of this patent is extended or adjusted under 35 U.S.C. 154(b) by 51 days.

(21) Appl. No.: 14/136,816

(22) Filed: Dec. 20, 2013

(65) Prior Publication Data

US 2014/0232416 A1    Aug. 21, 2014

(30) Foreign Application Priority Data

Dec. 21, 2012    (FR) ...................... 12 03570

(51) Int. Cl.
*H02S 50/10*   (2014.01)
*G01R 31/08*   (2006.01)
*G01R 31/12*   (2006.01)

(52) U.S. Cl.
CPC ............... *G01R 31/12* (2013.01); *H02S 50/10* (2014.12); *G01R 31/08* (2013.01)

(58) Field of Classification Search
CPC ...... G01R 31/08; G01R 31/40; G01R 31/12; H02S 50/10
USPC ........................................ 324/551
See application file for complete search history.

(56) References Cited

U.S. PATENT DOCUMENTS 3,408,564 A * 10/1968 Hoel .............................. 324/521
2012/0160297 A1    6/2012 Yamakawa et al.
(Continued)

FOREIGN PATENT DOCUMENTS

DE    102011007222 A1    10/2012
EP        1265076 A1 * 12/2002    ............. G01R 27/18
EP        2146518 A2    1/2010
(Continued)

OTHER PUBLICATIONS

Rivera et al., "Protoflight Photovoltaic Power Module System-Level Tests in the Space Power Facility," 24th Intersociety Energy Conversion Engineering Conference, Washington, D.C., Aug. 6-11, 1989, pp. 2601-2615.

*Primary Examiner* — Son Le
*Assistant Examiner* — Akm Zakaria
(74) *Attorney, Agent, or Firm* — IM IP Law PLLC; C. Andrew Im

(57) ABSTRACT

A system and method for detecting and locating an insulation flaw in a solar generator on a spacecraft. The solar generator comprises a plurality of flaps. Each flap bears at least one solar cell that is connected to an electrical distribution network and electrically insulated from the flap. Each flap is connected, by a first load and by a second load, to a first electrical line and a second electrical line, respectively. The ratio of the impedances of the first load and of the second load of a flap being denoted as an impedance ratio of the flap. The solar generator comprises at least two flaps exhibiting different respective impedance ratios. The system comprises a component for evaluating the currents flowing in the first and second electrical lines, and a detector for detecting and locating an insulation flaw in the solar generator based on the evaluations of the currents.

11 Claims, 2 Drawing Sheets

(56) References Cited

U.S. PATENT DOCUMENTS

2012/0274138 A1    11/2012   Bundschuh et al.
2013/0082724 A1*   4/2013   Noda et al. ............. 324/750.01
2015/0015298 A1*   1/2015   Merz et al. ............. 324/761.01
2015/0054523 A1*   2/2015   Perkinson ................... 324/510

FOREIGN PATENT DOCUMENTS

EP              2677330 A1 * 12/2013
JP              2012119382 A    6/2012
WO            2012100263 A2    7/2012
WO    WO 2012100263 A2 * 7/2012

\* cited by examiner

SYSTEM AND METHOD FOR DETECTING AND LOCATING AN INSULATION FLAW IN A SOLAR GENERATOR ON A SPACE VEHICLE

RELATED APPLICATIONS

This application claims priority from French Patent Application No. 12 03570 filed Dec. 21, 2012, which is incorporated herein by reference in its entirety.

TECHNICAL FIELD

The present invention belongs to the field of electrical energy generation onboard a spacecraft, such as a satellite in orbit around a celestial body. More particularly, the present invention relates to a system and a method for detecting and locating an insulation flaw in a solar generator on a spacecraft.

PRIOR ART

Spacecrafts, particularly satellites in orbit around a celestial body, generally comprise one or more solar generators in order to generate the electrical energy that is required for them to operate.

Generally, a solar generator on a satellite is in the form of an appendix of said satellite, substantially in panel form. Such a solar generator is generally composed of a plurality of flaps. Each flap bears a plurality of solar cells connected to an electrical distribution network that routes the electrical energy, provided by said solar cells, to electrical storage devices and to different electrical equipment of said satellite.

The solar cells are furthermore electrically insulated from the flaps, and said flaps are connected to a grounding line, most often by means of a load, such as a simple resistor, in order to provide protection for the solar generator against electrostatic discharges.

Nowadays, operating faults in solar generators on satellites in terrestrial orbit have been found. In particular, it is known that space debris, such as meteorites, can strike the solar generators and cause insulation flaws in some solar cells, which are then electrically connected to the flaps, and therefore to the electrical ground by means of the grounding line.

Such insulation flaws can be detected by measuring the current flowing in the grounding line. Nevertheless, no solution is known that allows such insulation flaws to be located on a solar generator, that is to say a solution that allows inter alia the flap on which the solar cell exhibiting an insulation flaw is situated to be identified.

SUMMARY OF THE INVENTION

The aim of the present invention is to overcome all or some of the limitations of the solutions from the prior art, notably those set out above, by proposing a solution that allows an insulation flaw in a solar generator on a spacecraft to be detected and located.

Furthermore, it is likewise an aim of the present invention to propose a solution that requires few modifications to be made to the current arrangements of solar generators.

In particular, solar generators are most often mounted so as to be able to rotate, by means of drive mechanisms, referred to as "SADM" ("Solar Array Drive Mechanism"), through which the electrical distribution network and the grounding line pass. SADM are generally complex devices, comprising inter alia swivel joints, and therefore provide little space for other cables to pass through. Consequently, the present invention aims at proposing a solution that requires few or no additional cables to pass through, in the SADM, in relation to current solar generators.

To this end, and according to a first aspect, the present invention relates to a system for detecting and locating an insulation flaw in a solar generator on a spacecraft, the solar generator comprising a plurality of flaps, each flap bearing at least one solar cell that is connected to an electrical distribution network and electrically insulated from said flap. Furthermore, each flap is connected, by a first load and by a second load, to a first electrical line and a second electrical line, respectively, said second electrical line being separate from the first electrical line. The ratio of the impedances of the first load and of the second load of a flap being denoted by "impedance ratio" of said flap, the solar generator comprises at least two flaps exhibiting different respective impedance ratios. Moreover, said system furthermore comprises:

means adapted to evaluating currents flowing in the first electrical line and the second electrical line, respectively, means adapted to detecting and locating an insulation flaw in the solar generator on the basis of the evaluations of the currents flowing in the first electrical line and the second electrical line, respectively.

"Evaluation of the current" means measurement or calculation of any parameter that represents the current under consideration. By way of example, said parameter is a voltage or a current. By way of example, measurement of the voltage on the terminals of a resistor of a known impedance, through which the current to be evaluated flows, constitutes an evaluation of said current.

Since the flaps are connected, by means of loads, to two separate electrical lines, and since at least two flaps exhibit different respective impedance ratios, it will be possible to distinguish these two flaps when locating an insulation flaw. More generally, it will be possible to distinguish at least two areas of the solar generator, each area corresponding to flaps exhibiting the same impedance ratio. Preferably, if the respective impedance ratios of the flaps of the solar generator are all different, it will then be possible to distinguish all of said flaps from the point of view of locating of the insulation flaw in the solar generator.

In particular embodiments, the system may furthermore comprise one or more of the following features, taken in isolation or according to all of the technically possible combinations.

In one particular embodiment, the solar cells of each flap being organized into strings arranged in parallel, each string comprising Ncs solar cells arranged in series, the position of a solar cell within a string being denoted by the "rank" of said solar cell, said system comprises means adapted to determining the rank of a solar cell exhibiting an insulation flaw on the basis inter alia of the evaluations of the currents flowing in the first electrical line and the second electrical line, respectively.

Indeed, an insulation flaw causes a short circuit between the string on which the insulation flaw is situated and the flap, so that said flap is put at the same electrical potential as that of the string at the location of said insulation flaw. This electrical potential is dependent on the position of said insulation flaw on the string, so that it is possible, by analysing the evaluation of the current flowing in the first electrical line or in the second electrical line, to determine the rank of the solar cell that has the insulation flaw.

In one particular embodiment, the first load and the second load of each flap are loads of a system for protecting against electrostatic discharges, the first electrical line and the second electrical line being grounding lines.

In other words, the same loads are used to protect against electrostatic discharges and to locate insulation flaws. With respect to systems for protecting against electrostatic discharges comprising a single load and a single grounding line, redundancy of protection is introduced by connecting the flaps to two different grounding lines. With respect to redundant systems for protecting against electrostatic discharges in which the flaps are connected by two identical loads to two respective grounding lines, the invention does not require any additional cable to pass through the SADM in order to locate the insulation flaw on the solar generator.

In one particular embodiment, said system comprises means adapted to low-pass filtering the evaluations of the currents flowing in the first electrical line and the second electrical line, respectively.

Such arrangements are advantageous in that the current provided by a solar generator is generally regulated by means of a chopper. Such a chopper is the cause of high-frequency noise (depending on the chopping frequency) in the evaluations of current, which it is advantageous to low-pass filter in order to improve the accuracy of the detection and location of the insulation flaw in the solar generator.

In one particular embodiment, all the flaps of the solar generator are connected to the same first electrical line and to the same second electrical line.

According to a second aspect, the present invention relates to a method for detecting and locating an insulation flaw in a solar generator on a spacecraft by means of a system according to any of the embodiments of the invention. Said method comprises steps of:

detecting an insulation flaw in a solar generator,
  comparing the evaluations of the currents flowing in the first electrical line and the second electrical line, respectively,
  locating the insulation flaw on the solar generator on the basis of the result of the comparison.

In particular modes of implementation, the method may furthermore comprise one or more of the following features, taken in isolation or according to all of the technically possible combinations.

In one particular mode of implementation, the comparison step comprises the calculation of a ratio of the evaluations of the currents flowing in the first electrical line and the second electrical line, respectively.

In one particular mode of implementation, the solar cells of each flap being organized into strings arranged in parallel, each string comprising Ncs solar cells arranged in series, the position of a solar cell within a string being denoted by the "rank" of said solar cell, said method comprises a prior step of characterizing an unitary contribution by each solar cell to the evaluation of the current flowing in the first electrical line or in the second electrical line. Said method furthermore comprises a step of determining the rank of a solar cell exhibiting an insulation flaw on the basis of said unitary contribution and of the evaluation of the current flowing in the first electrical line or in the second electrical line.

In one particular mode of implementation, an insulation flaw in the solar generator is detected when the evaluation of the current flowing in the first electrical line or in the second electrical line is higher than a predefined threshold value.

According to a third aspect, the present invention relates to a computer program product comprising a set of program code instructions which, when executed by a processor, implement a method for detecting and locating an insulation flaw in a solar generator on a spacecraft according to any of the modes of implementation of the invention.

BRIEF DESCRIPTION OF THE DRAWINGS

The invention will be better understood upon reading the description that follows, given by way of nonlimiting example, and provided with reference to the figures, in which.

In these figures, identical references from one figure to another denote identical or similar elements. For reasons of clarity, the elements shown are not to scale, unless indicated otherwise.

DETAILED DESCRIPTION OF EMBODIMENTS

The present invention relates to a system for detecting and locating an insulation flaw in a solar generator 20 on a spacecraft.

Figure 1:
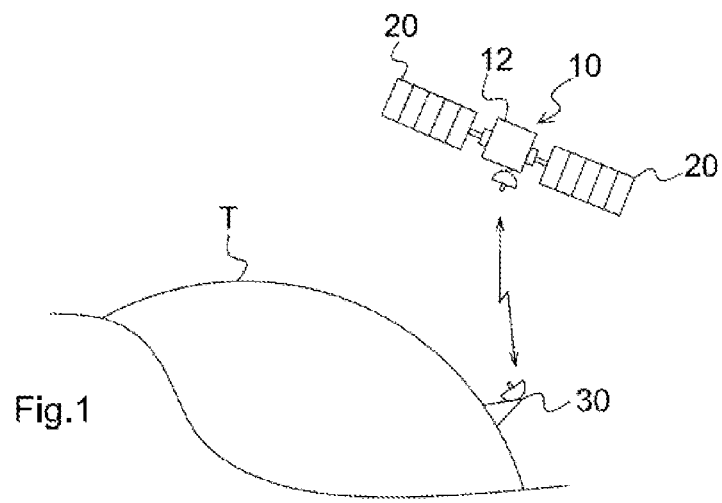
FIG. 1 shows a schematic representation of a system for detecting and locating an insulation flaw in a solar generator on a satellite in Earth orbit.

In the remainder of the description, and as illustrated by FIG. 1, the nonlimiting case where the spacecraft is a satellite 10 in orbit around Earth T is considered. Nothing precludes, in other examples, from considering other types of spacecraft, such as a space shuttle, a launcher etc., in orbit or not around a celestial body.

In the example shown, the satellite 10 comprises a body 12 and two solar generators 20 arranged on either side of said body 12. In the example illustrated by FIG. 1, the solar generators 20 are furthermore considered to be mounted so as to be able to rotate, by means of SADM 14. The solar generators 20 comprise flaps that bear solar cells 28 electrically insulated from said flaps.

Figure 2:
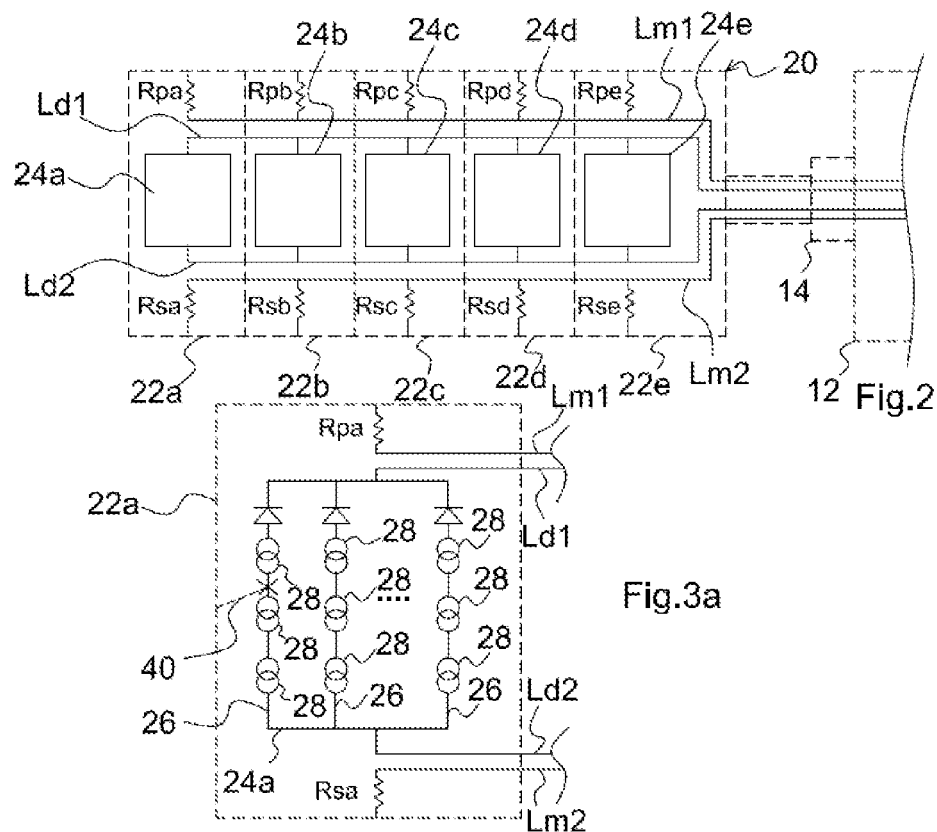
FIG. 2 shows a schematic representation of an example of an electrical assembly, on a solar generator, adapted to allowing an insulation flaw to be detected and located.

FIG. 2 is a very schematic representation of an example of an electrical assembly, on a solar generator 20, adapted to allowing an insulation flaw in said solar generator to be detected and located.

The solar generator 20 comprises a plurality of flaps, for example five flaps in the example illustrated by FIG. 2, which are respectively denoted by 22a, 22b, 22c, 22d and 22e.

Each flap 22a-22e bears an array of solar cells 28, said arrays being denoted by 24a, 24b, 24c, 24d and 24e, respectively, in FIG. 2. The arrays 24a-24e are electrically insulated from the flaps 22a-22e, and are connected to an electrical distribution network, schematically represented by a first distribution line Ld1 and a second distribution line Ld2. The first distribution line Ld1 and the second distribution line Ld2 connect the arrays 24a-24e to the body 12 of the satellite 10, by passing through the interior of the SADM 14, for example.

In order to allow an insulation flaw in a solar generator 20 to be detected and located, each flap 22a-22e is connected, by a first load Rpa-Rpe, to a first electrical line that is preferably connected to the electrical ground, referred to as "first grounding line" Lm1. Each flap 22a-22e is furthermore connected, by a second load Rsa-Rse, to a second electrical line that is preferably connected to the electrical ground, referred to as "second grounding line" Lm2. In the remainder of the description, the nonlimiting case where the first loads Rpa-Rpe and the second loads Rsa-Rse are all exclusively resistive is considered. Consequently, the first loads Rpa-Rpe of the flaps 22a-22e are subsequently referred to as "first resistors" Rpa-Rpe, while the second loads Rsa-Rse of said flaps are subsequently referred to as "second resistors" Rsa-Rse.

The first grounding line Lm1 and the second grounding line Lm2 connect the flaps 22a-22e to the body 12 of the satellite 10, by passing through the interior of the SADM 14, for example.

It is understood that the first resistors Rpa-Rpe, the second resistors Rsa-Rse, the first grounding line Lm1 and the second grounding line Lm2 furthermore constitute means for protecting the solar generator 20 against electrostatic discharges. Consequently, the system for detecting and locating an insulation flaw may likewise be implemented, without modification, as a system for protecting the solar generator 20 against electrostatic discharges.

The system for detecting and locating an insulation flaw furthermore comprises:
  means adapted to evaluating currents flowing in the first grounding line Lm1 and the second grounding line Lm2, respectively, referred to as "evaluation means",
  means adapted to detecting and locating an insulation flaw in the solar generator 20 on the basis of the evaluations of said currents flowing in the first grounding line Lm1 and the second grounding line Lm2, respectively, referred to as "detection and location means".

The evaluation means may take any suitable form known to a person skilled in the art. By way of example, it is possible to provide, on each of the first and second grounding lines Lm1, Lm2, a resistor of a known impedance, referred to as "measuring resistor" Rm, that is arranged so as to be passed through the current flowing in the grounding line under consideration. Thus, the voltage on the terminals of each of these measuring resistors Rm is representative of the current flowing in the first grounding line Lm1 and the second grounding line Lm2, respectively, and can be measured by using any conventional means.

The detection and location means may take any suitable form known to a person skilled in the art. By way of example, they may comprise a processor and an electronic memory that stores a computer program product. The computer program product is in the form of a set of program code instructions that, when executed by the processor, implement all or some of the steps of a method 50 for detecting and locating an insulation flaw, an example of implementation of which will be described in detail below. In one variant, said means comprise programmable logic circuits, of FPGA, PLD, etc., type, and/or specialized integrated circuits (ASIC), adapted to implementing all or some of the steps of said method 50 for detecting and locating an insulation flaw.

In one particular and nonlimiting embodiment, the evaluation means are onboard the satellite 10, while the detection and location means are remote from the satellite 10, for example on a ground station (visible in FIG. 1). In such a case, the satellite 10 comprises conventional means for transmitting the evaluations of said currents to the station 30, and said station 30 comprises conventional means for receiving said evaluations.

It should be noted that, in the example illustrated by FIG. 2, each flap 22a-22e is equipped with a specific first resistor Rpa-Rpe/second resistor Rsa-Rse pair. Nothing precludes, in other examples which are not illustrated by figures, from having some of these first resistors and/or second resistors shared between a plurality of flaps 22a-22e.

The term "impedance ratio" for a flap 22a-22e is used to denote the ratio of the impedance of the first resistor Rpa-Rpe to the impedance of the second resistor Rsa-Rse of this flap.

In one preferred embodiment, the respective impedance ratios of the various flaps 22a-22e are all different from one another. Such arrangements allow the flaps 22a-22e to be distinguished from the point of view of locating an insulation flaw. In other words, such arrangements allow that flap 22a-22e that has an insulation flaw to be determined when said insulation flaw has been detected in the solar generator 20.

Figure 3A:
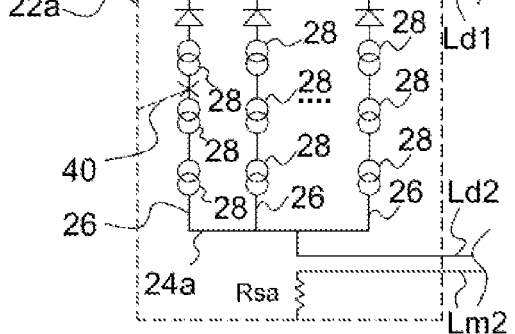
FIG. 3a shows a detailed view of the solar generator from FIG. 2, for a flap exhibiting an insulation flaw.

FIG. 3a shows a more detailed view of the solar generator 20 from FIG. 2 in the case, moreover, in which the flap 22a exhibits an insulation flaw (denoted by the reference 40 in FIG. 3a), for example due to a collision with a meteorite.

In the example illustrated by FIG. 3a, the solar cells 28 of the array 24a of the flap 22a are organized into strings 26 arranged in parallel, each string 26 comprising Ncs solar cells 28 arranged in series. It should be noted that the number Ncs of solar cells 28 per string 26 may be different from one flap to another on the solar generator 20. To render FIG. 3a readable, the number Ncs for the flap 22a is considered to be equal to 3.

The term "rank" of a solar cell 28 is used to denote the position of said solar cell in the string 26 under consideration. The first solar cell 28 in a string 26 therefore has rank one, the second solar cell 28 has rank two, the third solar cell 28 has rank three, etc.

In FIG. 3a, the flap 22a exhibits an insulation flaw between the solar cell 28 of rank two and the solar cell of rank three. Due to this insulation flaw, a short circuit is established between, on the one hand, a mid-point between the solar cell 28 of rank two and the solar cell of rank three and, on the other hand, the flap 22a. The flap 22a has thus been brought to the same potential as that of said mid-point, corresponding to a voltage Vd with reference to the electrical ground.

Figure 3B:
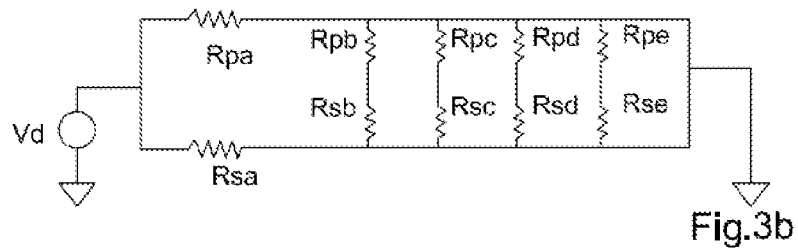
FIG. 3b shows an equivalent electrical circuit for the insulation flaw in the flap shown in FIG. 3a, FIGS. 4a, 4b and 4c show electrical circuits showing the same electrical circuit as the one in FIG. 3b, to which measuring means have been added (FIG. 4a) and equivalent electrical circuits (FIGS. 4b and 4c)

FIG. 3b shows an equivalent electrical circuit for the insulation flaw in the flap 22a shown in FIG. 3a. FIG. 3b notably shows a voltage source Vd, which is applied both to the first grounding line Lm1 and to the second grounding line Lm2, by means of the first resistor Rpa and the second resistor Rsa. For each of the other flaps 22b-22e, the first and second resistors are shown in series between the first grounding line Lm1 and the second grounding line Lm2.

Figure 4A:
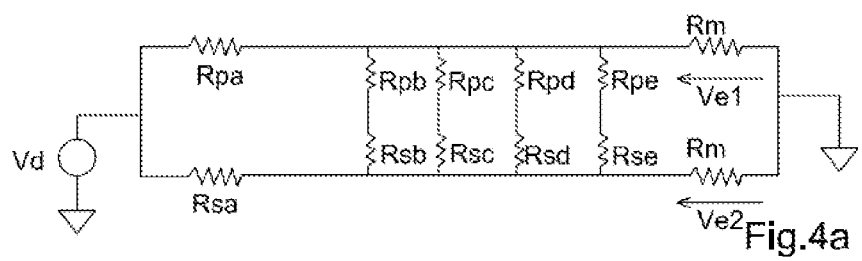

FIG. 4a shows the same electrical circuit as that in FIG. 3b, to which measuring means have been added on each of the first and second grounding lines Lm1, Lm2, in the present case measuring resistors Rm that are considered to be of the same impedance.

The voltage on the terminals of the measuring resistor Rm on the first grounding line Lm1 is denoted by Ve1, while the voltage on the terminals of the measuring resistor Rm on the second grounding line Lm2 is denoted by Ve2. It should be noted that, in the absence of an insulation flaw, the voltages Ve1 and Ve2 are theoretically zero. Consequently, it will be possible to detect an insulation flaw in the solar generator 20 by comparing the voltage Ve1 and/or the voltage Ve2 with a predefined threshold value, for example.

Figure 4B:
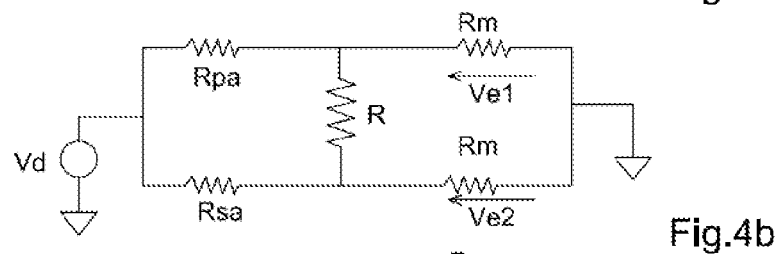
Figure 4C:
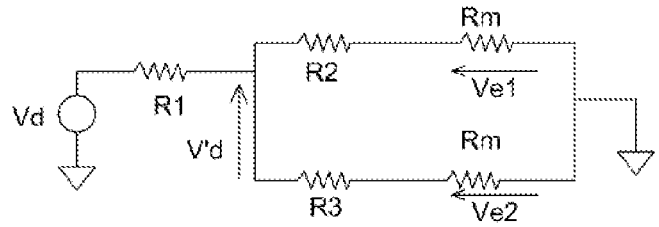

FIGS. 4b and 4c show equivalent electrical circuits for the one in FIG. 4a.

In FIG. 4b, the first resistors Rpb-Rpe and second resistors Rsb-Rse of the flaps 22b-22e have been replaced by their equivalent resistor R.

FIG. 4c shows an equivalent electrical circuit for the one in FIG. 4b, in which the first resistor Rpa, the second resistor Rsa and the resistor R, which are mounted in a triangle, have been replaced by the equivalent star circuit, having three resistors R1, R2 and R3. The resistor R2 is arranged in series with the measuring resistor Rm on the first grounding line Lm1, and the resistor R3 is arranged in series with the measuring resistor Rm on the second grounding line Lm2.

The values of the resistors R1, R2 and R3 are given by the following expressions:

$$R1 = \frac{Rpa \cdot Rsa}{Rpa + Rsa + R}$$

$$R2 = \frac{Rpa \cdot R}{Rpa + Rsa + R}$$

$$R3 = \frac{Rsa \cdot R}{Rpa + Rsa + R}$$

By denoting the voltage at the output of the resistor R1 by V'd, the voltages Ve1 and Ve2 can be expressed as follows:

$$Ve1 = \frac{Rm \cdot V'd}{Rm + R2}$$

$$Ve2 = \frac{Rm \cdot V'd}{Rm + R3}$$

Consequently, the ratio of the voltages Ve1 and Ve2 can be expressed in the following form:

$$\frac{Ve1}{Ve2} = \frac{Rm + R3}{Rm + R2}$$

It is consequently found that the ratio of the voltages Ve1 and Ve2 is dependent on the resistors R2 and R3, which are dependent on the first resistor Rpa and the second resistor Rsa of the flap 22a that exhibits the insulation flaw. In particular, it is found, on the basis of the expressions for said resistors R2 and R3, that different impedance ratios give different ratios for the voltages Ve1 and Ve2. Consequently, it will indeed be possible, by comparing the voltages Ve1 and Ve2 (which correspond to the evaluations of the currents flowing in the first and second grounding lines Lm1, Lm2), to distinguish the flaps for which the impedance ratios are different, and therefore to locate the previously detected insulation flaw.

For instance, the first resistors Rpa-Rpe and the second resistors Rsa-Rse take the following values:

|  | Impedance (kΩ) | Impedance ratio |
|---|---|---|
| Rpa | 250 | 5/1 |
| Rsa | 50 |  |
| Rpb | 150 | 2/1 |
| Rsb | 75 |  |
| Rpc | 75 | 1/1 |
| Rsc | 75 |  |
| Rpd | 75 | 1/2 |
| Rsd | 150 |  |
| Rpe | 50 | 1/5 |
| Rse | 250 |  |

It should be noted that such resistors can be obtained from resistors already used in current satellites. There are therefore already resistors certified for the space environment that can be used without modification and without additional certification for detecting and locating insulation flaws in a solar generator 20 on a satellite 10.

In one particular embodiment, the system for detecting and locating an insulation flaw comprises means adapted to low-pass filtering the evaluations of the currents flowing in the first grounding line Lm1 and the second grounding line Lm2, respectively, referred to as "low-pass filtering means". The low-pass filtering means may take any suitable form known to a person skilled in the art. For instance, an analogue low-pass filter, made up of a resistor and a capacitor (not shown in the figures), can be inserted on each of the first and second grounding lines Lm1, Lm2, upstream of the measuring resistors. The cut-off frequency of the low-pass filtering means is chosen so as to allow attenuation inter alia of the high-frequency noise introduced by a chopper used to regulate the current provided to the satellite 10.

Once the flap 22a exhibiting the insulation flaw has been identified, it is furthermore possible to determine the rank of the solar cell 28 exhibiting said insulation flaw. For instance, for the flaw illustrated in FIG. 3a, the flap 22a has been brought to the same potential as that of the mid-point between the solar cell 28 of rank two and the solar cell 28 of rank three. This potential is dependent on the number of solar cells 28 upstream of the insulation flaw with respect to the direction in which the current flows. Thus, the voltage Vd is dependent on the position of the insulation flaw on the string 26, and may be considered to be substantially proportional to the number of solar cells 28 upstream of the insulation flaw in the stream 26, for example. Equally, the voltages Ve1, Ve2 on the terminals of the measuring resistors Rm (evaluations of the currents flowing in the first and second grounding lines Lm1, Lm2) may be considered to be substantially proportional to the number of solar cells 28 upstream of the insulation flaw. Thus, if the unitary contribution by each solar cell 28 to the voltages Ve1 and Ve2 is known, it will be possible to determine the position of the insulation flaw on the string 26.

Figure 5:
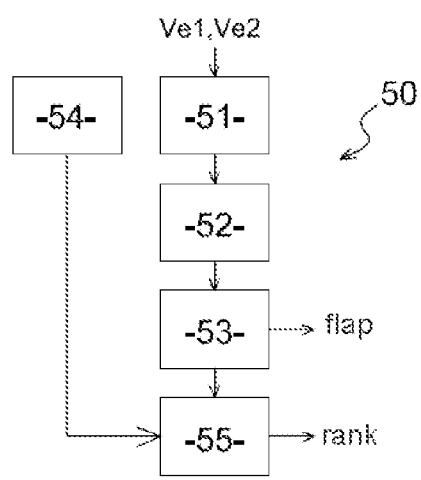
FIG. 5 shows a chart illustrating the main steps of an example of implementation of a method for detecting and locating an insulation flaw in a solar generator.

FIG. 5 shows the main steps of a method 50 for detecting and locating an insulation flaw in the solar generator 20 on the satellite 10, which are:
- 51 detecting an insulation flaw in the solar generator 20,
- 52 comparing the voltages Ve1 and Ve2 on the terminals of the measuring resistors (evaluations of the currents flowing in the first and second grounding lines Lm1, Lm2),
- 53 locating the insulation flaw in the solar generator 20 on the basis of the result of the comparison of the voltages Ve1 and Ve2.

During the detection step 51, the voltage Ve1 and/or the voltage Ve2 is/are compared with a predefined threshold value, for example. As long as the voltage Ve1 and/or the voltage Ve2 is/are lower than this predefined threshold value, no insulation flaw has been detected. When the voltage Ve1 and/or the voltage Ve2 becomes higher than this predefined threshold value, the solar generator 20 is considered to exhibit an insulation flaw.

During the step 52 of comparing the voltages Ve1 and Ve2, the ratio of said voltages Ve1 and Ve2 is calculated, for example. Indeed, as indicated previously, the ratio of said voltages Ve1 and Ve2 is dependent on the flap 22a-22e that exhibits the insulation flaw such that it allows determination, during the location step 53, of the flap 22a-22e that exhibits the previously detected insulation flaw.

Advantageously, the detection and location method 50 comprises, furthermore, a prior step 54 of characterizing the unitary contribution by each solar cell 28 to the voltage Ve1 and/or the voltage Ve2 on the terminals of the measuring resistors Rm. Once the flap exhibiting the insulation flaw has been identified in the course of location step 53, the method 50 comprises, furthermore, a step 55 of determining the rank of the solar cell 28 exhibiting the insulation flaw on the basis of said unitary contribution and on the basis of the voltage Ve1 and/or the voltage Ve2 on the terminals of the measuring resistors Rm.

More generally, it should be noted that the modes of implementation and embodiments under consideration above have been described by way of nonlimiting examples, and that other variants can consequently be envisaged.

In particular, the invention has been described by considering that all the respective impedance ratios of the flaps 22a-22e were all different. Nothing precludes, in other examples, from having some flaps 22a-22e exhibiting identical impedance ratios, as long as the impedance ratios of at least two flaps 22a-22e are different. For instance, if it is only required to distinguish, from the point of view of locating the insulation flaw, some areas of the solar generator 20, for example a first area on the side where the SADM 14 is situated and a second area on the opposite side from the SADM 14, it is possible to organize the flaps 22a-22e into two groups, with the flaps in one and the same group exhibiting the same impedance ratio, the flaps of two different groups exhibiting different impedance ratios.

Furthermore, the invention has been described by considering that all the flaps 22a-22e of the solar generator are connected to the same first grounding line Lm1 and to the same second grounding line Lm2, which is advantageous from a point of view of the number of cables to pass through the SADM 14. Nothing precludes, in other examples, from having a plurality of first grounding lines and/or a plurality of second grounding lines. For instance, it is possible to have two first grounding lines and two second grounding lines that are respectively associated with two separate groups of flaps 22a-22e. In each of these groups, the impedance ratios of the flaps are all different. On the other hand, it is possible to reuse the same impedance ratios in both groups.

The invention claimed is:

1. A system for detecting and locating an insulation flaw, comprising:
   a solar generator on a spacecraft comprising a plurality of flaps, each flap bearing at least one solar cell and being connected to a first electrical line by a first load and to a second electrical line by a second load, said at least one solar cell is connected to an electrical distribution network and said at least one solar cell is electrically insulated from said each flap such that current flows in the first and second electrical lines in response to an insulation flaw;
   an evaluation component to evaluate currents flowing in the first electrical line and the second electrical line, respectively;
   a detector to detect the insulation flaw in the solar generator based on evaluations of the currents flowing in at least one of the first electrical line and the second electrical line;
   wherein a ratio of impedances of the first load and of the second load of a flap is denoted as an impedance ratio of the flap;
   wherein the solar generator comprises at least two flaps exhibiting different respective impedance ratios; and
   wherein the detector is configured to locate the detected insulation flaw by comparing the evaluations of the currents flowing respectively in the first and second electrical lines with the respective impedance ratios of said at least two flaps.

2. The system according to claim 1, wherein the solar cells of each flap are organized into strings arranged in parallel, each string comprising a predetermined number of solar cells arranged in series, a position of a solar cell within a string is denoted as a rank of the solar cell; and further comprising a component for determining the rank of a solar cell exhibiting an insulation flaw based on the evaluations of the currents flowing in the first electrical line and the second electrical line, respectively.

3. The system according to claim 1, wherein the first load and the second load of said each flap are loads of the system for protecting against electrostatic discharges; and wherein the first electrical line and the second electrical line are grounding lines.

4. The System according to claim 1, further comprising a low-pass filter for low-pass filtering the evaluations of the currents flowing in the first electrical line and the second electrical line, respectively.

5. The system according to claim 1, wherein the respective impedance ratios of the flaps of the solar generator are all different.

6. The system according to claim 1, wherein all the flaps of the solar generator are connected to the same first electrical line and to the same second electrical line.

7. A method for detecting and locating an insulation flaw in a solar generator on a spacecraft, comprising the steps of:
   evaluating currents flowing in a first electrical line and a second electrical line, respectively, of the solar generator, the solar generator comprises a plurality of flaps, each flap bearing at least one solar cell and being connected to the first electrical line by the first load and to a second electrical line by a second load, said at least one solar cell is connected to an electrical distribution network and said at least one solar cell is electrically insulated from said each flap such that the current flows in the first and second electrical lines in response to an insulation flaw;
   detecting the insulation flaw in the solar generator based on evaluations of the currents flowing in at least one of the first electrical line and the second electrical line;
   wherein a ratio of impedances of the first load and of the second load of a flap is denoted as an impedance ratio of the flap;
   wherein the solar generator comprises at least two flaps exhibiting different respective impedance ratios; and
   locating the detected insulation flaw in the solar generator by comparing the evaluations of the currents flowing respectively in the first and second electrical lines with the respective impedance rations of said at least two flaps.

8. The method according to claim 7, further comprising the step of calculating a ratio of the currents flowing in the first electrical line and the second electrical line.

9. The method according claim 7, wherein the solar cells of each flap are organized into strings arranged in parallel, each string comprising a predetermined number of solar cells arranged in series, a position of a solar cell within a string is denoted as a rank of the solar cell; and further comprising the steps of:
   determining an unitary contribution by each solar cell to the evaluation of the current flowing in the first electrical line or in the second electrical line; and
   determining the rank of a solar cell exhibiting an insulation flaw based on the unitary contribution and the evaluation of the current flowing in the first electrical line or in the second electrical line.

10. The method according to claim 7, further comprising the step of detecting the insulation flaw in the solar generator when the evaluation of the current flowing in the first electrical line or in the second electrical line is higher than a predefined threshold value.

11. A non-transitory computer readable medium comprising a set of program code instructions to be executed by a processor to detect and locate an insulation flaw in a solar generator on a spacecraft, the code programs the processor to be configured to:

evaluate currents flowing in a first electrical line and a second electrical line, respectively, of the solar generator, the solar generator comprises a plurality of flaps, each flap bearing at least one solar cell and being connected to the first electrical line by the first load and to a second electrical line by a second load, said at least one solar cell is connected to an electrical distribution network and said at least one solar cell is electrically insulated from said each flap such that the current flows in the first and second electrical lines in response to an insulation flaw;

detect the insulation flaw in the solar generator based on evaluations of the currents flowing in at least one of the first electrical line and the second electrical line;

wherein a ratio of impedances of the first load and of the second load of a flap is denoted as an impedance ratio of the flap;

wherein the solar generator comprises at least two flaps exhibiting different respective impedance ratios; and locate the detected insulation flaw in the solar generator by comparing the evaluations of the currents flowing respectively in the first and second electrical lines with the respective impedance rations of said at least two flaps.

* * * * *